United States Patent [19]

Williams

[11] Patent Number: 4,910,643
[45] Date of Patent: Mar. 20, 1990

[54] THICK FILM, MULTI-LAYER, CERAMIC INTERCONNECTED CIRCUIT BOARD

[75] Inventor: Samuel L. Williams, Glassboro, N.J.

[73] Assignee: General Electric Company, Moorestown, N.J.

[21] Appl. No.: 203,359

[22] Filed: Jun. 6, 1988

[51] Int. Cl.$^4$ ............................................. H05K 1/09
[52] U.S. Cl. .................................... 361/414; 174/255; 361/403
[58] Field of Search ................ 174/68.5; 361/402, 403, 361/411, 414, 400, 406

[56] References Cited

U.S. PATENT DOCUMENTS

| | | | |
|---|---|---|---|
| 3,077,511 | 2/1963 | Bohrer et al. | 174/68.5 |
| 3,154,503 | 10/1964 | Janakirama-Rao et al. | 174/68.5 X |
| 3,293,501 | 12/1966 | Martin | 174/68.5 X |
| 3,374,110 | 3/1968 | Miller | 174/68.5 X |
| 3,506,482 | 4/1970 | Hirohata et al. | 174/68.5 X |
| 4,598,167 | 7/1986 | Ushifusa et al. | 174/68.5 |
| 4,628,149 | 12/1986 | Dohya | 361/411 X |

OTHER PUBLICATIONS

"Thick Film Dielectric Paste Multilayers-Crossovers ISO-OHM Series TC and RC," Bulletin D-102-1 of Ferro Corporation, 1982, two pages.
"Thick Film Screen Printable Conductor Pastes," Bulletin C-351-1 of Ferro Corporation, 1983, two pages.
Reprint of "Performance of Mixed-Bonded Thick-Film Conductors After Multiple Firing," by K. W. Allison and J. D. Provance, Electronic Packaging and Production, May 1979, Eight pages.
Pattuelli, E. G. et al., "Base Metal Thick Films for Large Area Hybrids", Circuits Manufacturing, Oct. 1983, pp. 36, 38, 40 and 42.
Bacher, R. J. et al., "Thick Film Processing for Higher Yields—Part One: Screen Printing", Insulation/Circuits, Jul. 1982, pp. 21-25.

Primary Examiner—Laramie E. Askin
Attorney, Agent, or Firm—Clement A. Berard, Jr.

[57] ABSTRACT

A thick film, multi-layer interconnected circuit board includes a substrate of an electrical insulating material which will withstand high temperatures, such as alumina, having over a surface thereof a plurality of stacked layers of a glass dielectric. Between each pair of dielectric layers is a thick film conductor layer. The dielectric layers have openings or vias therethrough which are filled with a conductive material which makes electrical contact with the adjacent conductive layers. A contact pad is over the topmost dielectric layer and is electrically connected to a via conductor material in the topmost dielectric layer. The contact pad is of a thick film conductive material which is a layer of glass having particles of a conductive material, such as a noble metal or mixture of noble metals, dispersed therein. A bonding layer is between the contact pad and the topmost dielectric layer and is bonded to both. The bonding layer is of a mixture of the glass of the dielectric layers and the thick film conductive material of the contact pad.

20 Claims, 1 Drawing Sheet

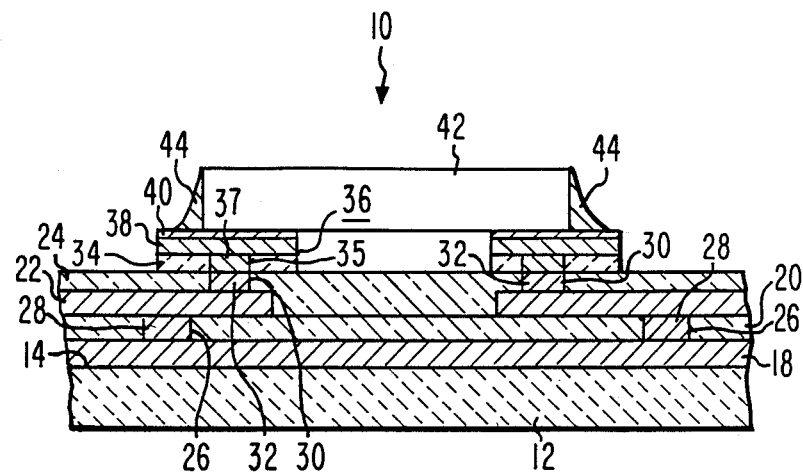

THICK FILM, MULTI-LAYER, CERAMIC INTERCONNECTED CIRCUIT BOARD

FIELD OF THE INVENTION

The present invention relates to a hybrid thick film, multi-layer, ceramic interconnected circuit board, and, more particularly, to a contact pad structure for such a multi-layer board to which electrical components can be attached.

BACKGROUND OF THE INVENTION

Thick film, multi-layer ceramic interconnected circuit boards, in general, include a substrate of an insulating material, such as alumina, which can withstand high temperatures having on a surface thereof a plurality of thick film conductor layers separated by layers of a dielectric material. The thick film conductor layers are generally formed of a mixture of a glass frit and particles of a conductive material which is fired on the substrate to form a layer of glass having the conductive particles dispersed therethrough. The dielectric layers are generally of a glass fired on the substrate. The dielectric layers have openings or "vias" therethrough which are filled with a conductive material to connect the conductive layers in a desired circuit arrangement. The conductive layers are in the form of a circuit pattern, and can include areas forming resistors and capacitors. On the outermost dielectric layer are contact pads of a conductive material which are connected to the underlying conductive layers by the conductive material in the vias. Electrical components, such as integrated circuits, transistors, diodes, capacitors, resistors and the like, are mounted on and soldered to the contact pads. The contact pads are also generally made of a thick film material which is not only electrically conductive, but is also easily soldered to.

There are a number of concerns with regard to this type of interconnected circuit board. One concern is that the contact pads be strongly bonded to the board. Since the thick film conductive material used for the contact pads does not adhere well to the glass generally used for the dielectric layer, it has been the practice to have the contact pads completely cover the via conductive material which extends completely through one or more of the layers of the circuit board and perhaps even to the substrate. Thus, the area of the via conductive material is generally the same as the area of the contact pads. In order to bond the electrical components to the contact pads, the pads must be relatively large. Therefore, the area of the via conductive material is relatively large so as to take up considerable room on the board. This undesirably makes more difficult the layout of the circuit conductors, and increases the cost of the board because large amounts of the conductive material, which is very expensive, are required. Another problem is the inability to remove and replace components on the contact pads so as to repair or otherwise change the circuit on the board. I have discovered that when a component is unsoldered and replaced on a thick film contact pad about two or three times, the thick film conductive material of the contact pad becomes unbonded from the underlying dielectric layers rendering the circuit board unusable.

SUMMARY OF THE INVENTION

A thick film, interconnected circuit board includes a substrate of an insulating material which can withstand high temperatures having over a surface thereof at least one layer of a conductive material and a layer of a glass dielectric over the conductive layer. The dielectric layer has an opening therethrough containing a conductive material which contacts the conductive layer. A contact pad is over the dielectric layer and electrically contacts the conductive layer in the opening in the dielectric layer. The contact pad is a layer of a glass having particles of a conductive material dispersed therethrough. A bonding layer is between the contact pad and the dielectric layer. The bonding layer is a mixture of the glass of the dielectric layer and the material of the contact pad.

BRIEF DESCRIPTION OF THE DRAWING

The FIGURE of the drawing is a sectional view of a multi-layer, interconnected circuit board which incorporates the present invention.

DETAILED DESCRIPTION OF PREFERRED EMBODIMENT

Referring to the drawing, a multi-layer, ceramic interconnected circuit board which incorporates the present invention is generally designated as 10. Interconnected circuit board 10 includes a substrate 12 of an insulating material which will withstand high temperatures, such as alumina. On a surface 14 of the substrate 12 is a first conductive layer 18. The first conductive layer 18 is covered with a first dielectric layer 20. A second conductive layer 22 is on the first dielectric layer 20 and is covered with a second dielectric layer 24. The dielectric layers 20 and 24 are of a glass, such as a barium borosilicate glass, which is fired on the board 10. One dielectric material suitable for this purpose is sold by the Electronic Materials Division of Ferro Corporation of Santa Barbara, Calif. under their trademark ISO-OHM series TC and RC multilayer-crossover pastes, such as TC1007. The conductive layers 18 and 22 are of a thick film paste which is a mixture of a glass frit and conductive particles. The paste is coated on the board and fired to form a layer of glass having the conductive particles dispersed therethroughout. The glass frit is generally a borosilicate glass. The conductive particles are generally a noble metal, such as gold, platinum, palladium or silver or mixtures thereof. Preferably the conductive particles are a mixture of gold and either platinum or palladium. Some conductive pastes which are suitable for this purpose are sold by the Electronic Materials Division of Ferro Corporation of Santa Barbara, Calif. under the trademarks CONDUCTROX and MULTIFIRE thick film conductor pastes, such as formula numbers 3127 and 3141. The conductive layers 18 and 22 are in the form of conductive lines which form the conductors of a particular circuit.

The dielectric layer 20 has openings or vias 26 therethrough which extend between the first and second conductor layers 18 and 22. The vias 26 are filled with a conductive material 28 which electrically connects the conductive lines of the first and second conductive layers 18 and 22. The second dielectric layer 24 has openings or vias 30 therethrough which extend to the second conductive layer 22. The vias 30 are also filled with a conductive material 32. The conductive material 32 in the vias 30 is electrically connected to the conductive lines of the second conductive layer 22. The via conductive material 28 and 30 may be of the same thick film conductive material as the conductive layers 18 and 22.

On the second dielectric layer 24 and over the via conductive material 32 are bonding layers 34. Each of the bonding layers 34 has an opening or via 35 therethrough which is filled with a conductive material 37. Over the bonding layers 34 are contact pads 36 which electrically contact the via conductive material 37. The bonding layers 34 are of the same area as the contact pads 36. The contact pads 36 are of a thick film conductive material, which can be of the same material as the conductive layers 18 and 22. Preferably, the contact pads 36 are of a first portion 38 directly on the bonding layer 34 which contains sufficient conductive particles so as to be highly conductive, such as a Ferro Corporation MULTIFIRE 3127 conductive paste, and a second portion 40 over the first portion 38 which contains sufficient conductive particles so as to be easily soldered to, such as a Ferro Corporation MULTIFIRE 3141 conductive paste.

The bonding layers 34 are of a mixture of the same glass used for the dielectric layers 20 and 24, and the thick film conductive material used in the first portion 38 of the contact pad 36. More particularly, the bonding layers 34 are made from a mixture by weight of about 30% to 60% of the thick film conductive material and about 70% to 40% of the dielectric glass. Preferably, the bonding layers 34 are made by weight of about 40% of the thick film conductive material and 60% of the dielectric glass. Thus, if the dielectric layers are made of a barium borosilicate glass, such as the Ferro Corporation ISO-OHM Series TC-1007 dielectric paste, and the contact pad 36 is made of a mixture of a borosilicate glass frit and particles of platinum and gold, such as the Ferro Corporation MULTIFIRE 3127 thick film conductor paste, the bonding layer 34 would be made of a mixture by weight of about 30% to 60% of the MULTIFIRE 3127 and about 70% to 40% of the ISO-OHM TC1007.

The multi-layer, interconnected circuit board 10 is made by first applying the first conductive layer 18 onto the substrate surface 14. This can be achieved by using a thick film conductive paste which is a mixture of the glass frit and the conductive particles in a carrier suitable for screen printing. The thick film conductive paste is screen printed over the first substrate surface 14 and fired at a temperature at which the glass frit fuses to form a layer of glass having the conductive particles embedded therein. For a thick film paste having a borosilicate glass frit and conductive particles of gold and platinum, the firing temperature is generally between 800° C. and 950° C.

The first dielectric layer 20 is then screen printed over the first conductive layer 18. This can be achieved by using a dielectric glass frit in a carrier suitable for screen printing and screen printing the material onto the first conductive layer 18 and any exposed area of the substrate surface 14 not covered by the first conductive layer 18. The layer is then fired at a temperature at which the glass frit fuses and forms a layer of the dielectric glass. For a barium borosilicate glass, the firing temperature in generally between 850° C. and 1000° C. However, the pattern in the screen used to apply the first dielectric layer 20 is such that it leaves blank areas in the first dielectric layer 20 where the vias 26 are to be provided. After the first dielectric layer 20 is fired, a conductive material is screen printed in the via areas 26 and fired to form the via conductors 28. The second conductive layer 22 is then applied over the first dielectric layer 20 in the same manner as the first conductive layer 18. After the second conductive layer 22 is fired, the second dielectric layer 24 is applied over the second conductive layer 22 in the same manner as the other dielectric layer 20. The second dielectric layer 24 is provided with blank areas forming the vias 30 which are then filled with the conductive material and fired to form the via conductors 32.

The bonding layers 34 are then applied to the second dielectric layer 24 over the via conductors 32. The mixture of the bonding layers 34 in a carrier suitable for screen printing is screen printed over the second dielectric layer 24 and fired to fuse the glass in the mixture. The contact pads 36 are then applied over the bonding layers 34 by screen printing and firing. If the contact pads 36 have two portions, the first portion 38 is applied first and the second portion 40 is applied and fired over the first portion 38. After the contact pads 36 are formed, electrical components 42, such as resistors, capacitors and the like, can be placed on the board 10 with the terminals of the components 42 being over the contact pads 36. The terminals of the components 42 can be secured to the contact pads 36, such as by solder 44.

I have found that using the bonding layers 34 between the contact pads 36 and the underlying dielectric layer 24 provides a contact pad 36 with very good bond strength. Using a contact pad material which contained a borosilicate glass and a mixture of platinum and gold (Ferro Corporation MULTIFIRE 3127) and a bonding layer material of a mixture of by weight 40% of the contact pad material and 60% of a barium borosilicate glass (Ferro Corporation ISO-OHM TC 1007) with a wire soldered to the contact pad 36, pull strengths of up to about 9 to 10 pounds were obtained before the bond was broken. When the bond was broken it was often in the dielectric layer beneath the bonding layer 34. By way of comparison, contact pads applied directly to a dielectric layer, without a bonding layer 34, exhibited pull strengths of about 3 to 4 pounds.

Since the multi-layer interconnected circuit board 10 the present invention provides a strong bond between the bonding pads 36 and the topmost dielectric layer 24, the via conductors do not have to be of the same area as the contact pads and they do not have to extend completely through all of the dielectric and conductor layers to the substrate. Thus, the via conductors can be made much smaller in area, for example about 11 mils on a side rather than the size of the bonding pads which are generally 30 mils by 40 mils, so as to greatly reduce the area of the board taken up by the via conductors. The bonding pads may be of various sizes (e.g. 30 by 40 mils, 30 by 100 mils, 100 by 200 mils) depending on the size of the component to be soldered thereto, and may be connected to vias of various sizes (e.g. 15 by 20 mils, 25 by 25 mils, etc.). This produces a much more economical circuit board because the amount of very expensive noble metal conductor paste is substantially reduced.

I have also found that by using the bonding layer 34 between the contact pad 36 and the dielectric layer 24, the ability to remove and replace electrical components on the contact pads 36 has increased. Heretofore, when a components was unsoldered and replaced about two or three times, the contact pad was damaged rendering the board unusable. However, with the circuit board of the present invention, components could be unsoldered and replaced up to 10 or 15 times without damaging the contact pads 36. Thus, there is provided by the present invention a thick film interconnected circuit board in which the thick film contact pads have improved bond strengths to the topmost dielectric layer, the via conductors can be made smaller in area, and which allows electrical components to be removed and replaced on the contact pads a great number of times without loosing the ability to achieve reliable solder connections to the contact pads.

I claim:

1. An interconnected circuit board comprising:
   a substrate of a material which will withstand high temperatures;
   at least one layer of a fired conductive material over a surface of said substrate;
   a layer of a fired glass dielectric material over the conductive layer;
   an opening in said dielectric layer;
   a fired conductive material in said opening making contact with the conductive layer;
   a conductive contact pad over said dielectric layer and electrically connected to the conductive material extending through the opening in said dielectric layer, said contact pad being a layer of a fired conductive material including glass and conductive particles dispersed therein; and
   a bonding layer between the contact pad and the dielectric layer, said bonding layer being a fired mixture of the glass of the dielectric layer and the conductive material of the contact pad.

2. A circuit board in accordance with claim 1 in which the bonding layer includes a mixture by weight of about 30% to 60% of the material of the contact pad and about 70% to 40% of the glass of the dielectric layer.

3. A circuit board in accordance with claim 2 in which the bonding layer is a mixture by weight of about 40% of the material of the contact pad and about 60% of the glass of the dielectric layer.

4. A circuit board in accordance with claim 3 in which the contact pad material is a layer of a borosilicate glass having dispersed therein particles of a noble metal or a mixture of noble metals.

5. A circuit board in accordance with claim 4 in which the contact pad material contains a mixture of particles of gold and either platinum or palladium.

6. A circuit board in accordance with claim 5 in which the dielectric glass is a barium borosilicate glass.

7. A circuit board in accordance with claim 1 in which the conductive material in the opening in the dielectric layer is of an area smaller than the area of the contact pad.

8. A multi-layer, interconnected circuit board comprising:
   a substrate of an electrical insulating material which will withstand high temperatures;
   a plurality of fired glass dielectric layers stacked over a surface of said substrate;
   a separate thick film conductive layer between each pair of adjacent dielectric layers, each of said conductive layers being a layer of a fired conductive material including glass and particles of a conductive material dispersed therein;
   each of said dielectric layers between a pair of conductive layers having at least one opening therethrough which is filled with a fired conductive material making contact with at least one of the conductive layers, and the topmost dielectric layer having an opening therethrough which is filled with a conductive material making contact with at least one conductive layer;
   a conductive contact pad over the topmost dielectric layer and electrically connected to the conductive material said contact pad being a layer of a fired conductive material including glass and conductive particles dispersed therein; and
   a bonding layer between the contact pad and the topmost dielectric layer, said bonding layer being a fired mixture of the glass of the dielectric layers and the conductive material of the contact pad.

9. A circuit board in accordance with claim 8 in which the bonding layer includes a mixture by weight of about 30% to 60% of the material of the contact pad and about 70% to 40% of the glass of the dielectric layers.

10. A circuit board in accordance with claim 9 in which the bonding layer includes a mixture by weight of about 40% of the material of the contact pad and about 60% of the glass of the dielectric layers.

11. A circuit board in accordance with claim 10 in which the contact pad material is a layer of a borosilicate glass having dispersed therein particles of a noble metal or a mixture of noble metals.

12. A circuit board in accordance with claim 11 in which the contact pad material contains a mixture of particles of gold and either platinum or palladium.

13. A circuit board in accordance with claim 12 in which the dielectric glass is a barium borosilicate glass.

14. A circuit board in accordance with claim 8 in which the conductive material in the openings in the dielectric layers is of an area smaller than the area of the contact pad.

15. A circuit board wherein a conductive exposed contact pad conductively connects to an internal conductor by a via through a glass dielectric layer covering said internal conductor, said circuit board comprising:
   a bonding pad on said dielectric layer over said via, said bonding pad being substantially larger than said via and having an aperture of about the size of said via located over said via, whereby conductive contact can be made to the internal conductor through the aperture and the via, said bonding pad being formed from a mixture of the glass of the dielectric layer and a conductive material including glass and conductive metal particles dispersed therein; and
   said exposed conductive contact pad lying over said bonding pad, said contact pad being substantially larger than said via but not substantially larger than said bonding pad, said contact pad being formed of said conductive material, the conductive material of said contact pad making conductive connection to said internal conductor through conductive material in said aperture and said via.

16. A circuit board in accordance with claim 15 in which the bonding pad includes a mixture by weight of about 30% to 60% of the conductive material of the contact pad and about 70% to 40% of the glass of the dielectric layer.

17. A circuit board in accordance with claim 16 in which the bonding pad is a mixture by weight of about 40% of the conductive material of the contact pad and about 60% of the glass of the dielectric layer.

18. A circuit board in accordance with claim 17 in which the contact pad conductive material is a layer of a borosilicate glass having dispersed therein particles of a noble metal or a mixture of noble metals.

19. A circuit board in accordance with claim 18 in which the contact pad conductive material contains a mixture of particles of gold and either platinum or palladium.

20. A circuit board in accordance with claim 19 in which the glass of the dielectric layer is a barium borosilicate glass.

* * * * *

UNITED STATES PATENT AND TRADEMARK OFFICE
CERTIFICATE OF CORRECTION

PATENT NO. : 4,910,643

DATED : March 20, 1990

INVENTOR(S): Samuel L. Williams

It is certified that error appears in the above-identified patent and that said Letters Patent is hereby corrected as shown below:

Column 6, line 7, after "material" insert --extending through the opening in the topmost dielectric layer,--.

Signed and Sealed this

Twenty-third Day of July, 1991

Attest:

HARRY F. MANBECK, JR.

Attesting Officer

Commissioner of Patents and Trademarks